(12) United States Patent
Garandet et al.

(10) Patent No.: US 10,023,972 B2
(45) Date of Patent: Jul. 17, 2018

(54) SUBSTRATE FOR SOLIDIFYING A SILICON INGOT

(71) Applicant: COMMISSARIAT A L'ENERGIE ATOMIQUE ET AUX ENERGIES ALTERNATIVES, Paris (FR)

(72) Inventors: Jean-Paul Garandet, Le Bourget du Lac (FR); Denis Camel, Chambery (FR); Béatrice Drevet, Grenoble (FR); Nicolas Eustathopoulos, Grenoble (FR); Charles Huguet, Paris (FR); Johann Testard, Veyrier du Lac (FR); Rayisa Voytovych, Echriolles (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 0 days.

(21) Appl. No.: 15/022,440

(22) PCT Filed: Sep. 12, 2014

(86) PCT No.: PCT/IB2014/064473
§ 371 (c)(1),
(2) Date: Mar. 16, 2016

(87) PCT Pub. No.: WO2015/036975
PCT Pub. Date: Mar. 19, 2015

(65) Prior Publication Data
US 2016/0230305 A1    Aug. 11, 2016

(30) Foreign Application Priority Data

Sep. 16, 2013 (FR) ..................... 13 58904

(51) Int. Cl.
*C04B 35/14* (2006.01)
*C30B 11/00* (2006.01)
(Continued)

(52) U.S. Cl.
CPC .............. *C30B 11/002* (2013.01); *B05D 7/50* (2013.01); *C01B 33/021* (2013.01);
(Continued)

(58) Field of Classification Search
CPC ... C30B 11/002; C30B 35/002; C01B 33/021; B05D 7/50; C04B 41/009; C04B 41/52;
(Continued)

(56) References Cited

U.S. PATENT DOCUMENTS 5,147,801 A * 9/1992 Suzuki .................. C12M 23/04
428/34.3
7,378,128 B2  5/2008 Rancoule
(Continued)

FOREIGN PATENT DOCUMENTS

CN    1946881 A    4/2007
CN  101194051 A    6/2008
(Continued)

OTHER PUBLICATIONS

English Translation of Keiichiro et al. JP2013-227171, provided by the Espace.net website, internet retrieval date Sep. 15, 2017.*
(Continued)

*Primary Examiner* — Jonathan C Langman
(74) *Attorney, Agent, or Firm* — Oliff PLC

(57) ABSTRACT

A substrate, in particular intended for contact with liquid silicon, wherein it is at least partially surface-coated with a multilayer coating formed by: at least one layer, known as the adhesion layer, contiguous with the substrate, having an open porosity of at least 30%, and formed of a material comprising silica and silicon nitride, said material having a silica content of between 10 wt.-% and 55 wt.-% in relation to the total weight thereof; and a layer different from the adhesion layer, known as the release layer, located on the surface of the adhesion layer and formed of a material
(Continued)

Figure 1:
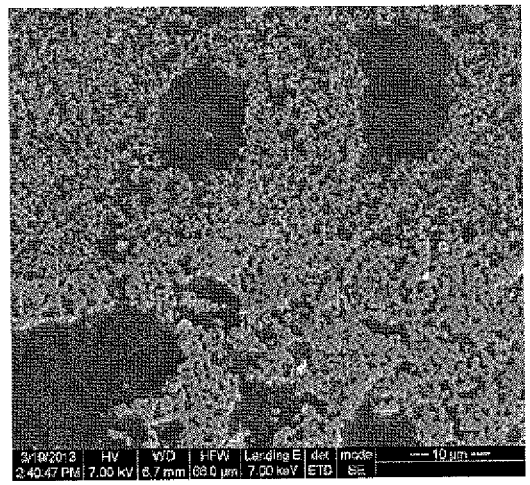

including silica and silicon nitride, said material having a silica content of between 2 wt.-% and 10 wt.-% in relation to the total weight thereof.

19 Claims, 2 Drawing Sheets

(51) Int. Cl.
    *C04B 41/89*     (2006.01)
    *C04B 41/00*     (2006.01)
    *C04B 41/52*     (2006.01)
    *C30B 29/06*     (2006.01)
    *C30B 35/00*     (2006.01)
    *B05D 7/00*     (2006.01)
    *C01B 33/021*     (2006.01)
    *C04B 111/00*     (2006.01)

(52) U.S. Cl.
CPC ............ *C04B 41/009* (2013.01); *C04B 41/52* (2013.01); *C04B 41/89* (2013.01); *C30B 29/06* (2013.01); *C30B 35/002* (2013.01); *C04B 2111/00879* (2013.01)

(58) Field of Classification Search
CPC .................... C04B 41/89; C04B 29/06; C04B 2111/00879; C04B 35/584; C04B 35/14; C04B 41/4582; C04B 41/4539; C04B 41/5035; C04B 41/5066
See application file for complete search history.

(56) References Cited

U.S. PATENT DOCUMENTS

| | | | | |
|---|---|---|---|---|
| 2007/0240635 A1* | 10/2007 | Rancoule | ................ | C30B 15/10 117/208 |
| 2008/0196209 A1* | 8/2008 | Friestad | ................ | C30B 11/003 23/295 R |
| 2008/0260608 A1* | 10/2008 | Rancoule | .............. | C04B 35/584 422/245.1 |
| 2010/0034723 A1* | 2/2010 | Friestad | ................ | C30B 11/003 423/348 |

FOREIGN PATENT DOCUMENTS

| | | | | |
|---|---|---|---|---|
| CN | 101278078 A | | 10/2008 | |
| JP | 2013-343987 | * | 11/2013 | ............ C30B 15/10 |
| WO | 2005/106084 A1 | | 11/2005 | |
| WO | 2006/132536 A1 | | 12/2006 | |
| WO | 2007/039310 A1 | | 4/2007 | |

OTHER PUBLICATIONS

Jan. 5, 2015 Search Report issued in International Patent Application issued in PCT/IB2014/064473.
Jan. 5, 2015 Written Opinion issued in International Patent Application No. PCT/IB2014/064473.
Mar. 22, 2016 International Report on Patentability issued in International Application No. PCT/IB2014/064473.
Mar. 15, 2017 Office Action issued in Chinese Patent Application No. 201480050809.1.

* cited by examiner

SUBSTRATE FOR SOLIDIFYING A SILICON INGOT

The present invention relates to a substrate which has a particular coating and which may advantageously be brought into contact with molten silicon.

It also relates to a process for preparing such a substrate.

Advantageously, the substrate is a crucible.

Thus, the present invention relates more particularly to a crucible for solidifying a silicon ingot from molten silicon.

The invention also relates to the use of such a crucible for treating silicon in the molten state.

The crucibles according to the invention can in particular be used in processes for melting and solidifying silicon, for the purposes for example of obtaining highly pure silicon for applications in the generation of photovoltaic energy. Thus, photovoltaic cells are essentially fabricated from monocrystalline or polycrystalline silicon, obtained from the solidification of liquid silicon in crucibles. It is the wafers cut from the ingot formed within the crucible which serve as a basis for the fabrication of the cells.

The crucibles considered for the growth of the ingot are generally crucibles made of silica, coated with a porous layer of oxidized silicon nitride so as to prevent reaction of the silicon with the crucible and adhesion of the ingot to the crucible after solidification.

More specifically, this release behavior is essentially based on the presence of silicon nitride, $Si_3N_4$, of weak cohesion, partially oxidized in the form of silica, at the surface of the internal walls of the crucibles to which the silicon adheres during cooling thereof. On cooling, the silicon ingot detaches from these walls by cohesive rupture within the silicon nitride layer, thus relaxing the mechanical stresses resulting from the difference in thermal expansion coefficients.

The presence of silica confers on the coated crucible, on the one hand, a relative internal cohesion and a slight adhesion to the crucible, and, on the other hand, a limitation of the infiltration by the liquid silicon.

However, the coating may easily be indented by the pieces of silicon deposited in the crucible. Thus, it is necessary to deposit it in considerable thickness, of about several hundred micrometers, in order to guarantee the absence of any direct contact between the silicon and the crucible that would lead to the ingot adhering to said crucible.

It is known practice to also use reusable crucibles. However, the amount of coating entrained with the silicon ingot remains greater than the thin surface layer that was incorporated into the liquid silicon by reaction. Indeed, because of the weak cohesion given to the coating in order to ensure its release function, the detachment is generally carried out within the thickness thereof. In addition, associated with this weak cohesion is a weak adhesion of the coating to the walls of the crucible, which easily leads to detachment thereof, and therefore the need to completely renew it.

As a result, there is in any case a considerable consumption of coating.

Furthermore, owing to the processes for producing and processing silicon nitride powder, these coatings do not make it possible to prevent contamination of the silicon with the impurities present in the $Si_3N_4$ powders.

For obvious reasons, this contamination, which may exist in the zones of the silicon ingot formed in direct contact with or close to the walls of the crucible, makes part of the ingot unsuitable for use in photovoltaic applications.

Indeed, the large amount of coating deposited, combined with the use of crucibles which are generally of low purity, results in significant pollution of the silicon ingot, which results in particular in the presence of peripheral regions of about two centimeters in thickness where the electrical properties are highly degraded.

Consequently, it would be advantageous to have reusable coatings for reusable crucibles, in order to reduce coating consumption and take advantage of the purification of the reusable part of the coating and which results from the successive cycles of silicon melting and crystallization.

For this, it is known practice to increase the cohesion of the coating, for example by increasing the silica content.

U.S. Pat. No. 7,378,128 provides coatings for crucibles comprising layers with a high silica content. However, the increase in silica content results in an increase in pollution of the silicon with oxygen, and also in increased adhesion on the silicon ingot, compromising reuse.

There therefore remains at the current time a need for substrates, in particular solidification crucibles, suitable for the crystallization of highly pure silicon ingots in reusable crucibles.

In particular, there remains a need for substrates, in particular crucibles, which make it possible to easily detach the silicon ingot after cooling thereof, while limiting the contamination of this ingot with the coating of said substrate, and which are, in addition, reusable.

Finally, in the perspective of industrial-scale production, it is desirable to provide a process for producing such substrates using low-cost techniques which require only a restricted number of preparation steps.

The present invention aims precisely to provide novel substrates, in particular crucibles, for solidifying a silicon ingot from molten silicon, satisfying these expectations.

The inventors have in fact discovered that the abovementioned problems can be solved by at least partially covering the surface of a substrate intended to be brought into contact with molten silicon, with a multilayer coating formed from at least two layers having specific silica contents.

Thus, according to a first of its aspects, the present invention relates to a substrate, in particular intended for contact with liquid silicon, characterized in that it is at least partially surface-coated with a multilayer coating formed from at least one layer, termed tie layer, contiguous with said substrate, having an open porosity of at least 30%, and formed from a material based on silica and on silicon nitride, said material having a silica content of between 10% and 55% by weight relative to the total weight thereof, and a layer distinct from the tie layer, termed release layer, located at the surface of the tie layer, and formed from a material based on silica and on silicon nitride, said material having a silica content of between 2% and 10% by weight relative to the total weight thereof.

For the purposes of the invention, the expression "multilayer coating" is intended to denote a coating comprising at least two distinct and superposed layers.

A layer having an "open porosity" is intended to mean a layer in which the pores communicate with one another so as to create a space internal to the layer which is accessible from the exterior thereof, and therefore "fillable".

According to the invention, the tie and release layers are two distinct layers. The term "distinct" layers is intended to denote layers having different compositions. They are therefore discernible from one another.

The formation of a multilayer coating according to the invention proves to be particularly advantageous in several respects.

First of all, a substrate covered, on its surface intended to be brought into contact with molten silicon, with a multilayer coating according to the invention only slightly pollutes the silicon with oxygen and thus makes it possible to guarantee an increased level of purity for the corresponding silicon ingot.

As demonstrated in the examples which follow, the substrates according to the invention make it possible to significantly reduce the pollution with the coating. The substrates according to the invention may thus be reused a large number of times by improving their properties and prove, in this respect, particularly advantageous from an industrial point of view.

The presence of the multilayer coating according to the invention also makes it possible to obtain a substrate, in particular a crucible, which is reusable as such, i.e. without requiring prior treatment steps before reuse.

Advantageously, the tie layer is a layer which does not need to be renewed at each use and the release layer is a renewable layer.

Preferably, the tie layer of the multilayer coating represents at least 80% of the total thickness of said coating. Such a thickness makes it possible in particular to minimize the consumption of material linked to the renewal of the release layer.

According to one implementation variant, the tie layer has a thickness of between 100 and 500 micrometers, preferably of between 200 and 300 micrometers, and the release layer has a thickness of between 10 and 100 micrometers, preferably of between 20 and 60 micrometers.

These thicknesses are determined conventionally by scanning electron microscopy (SEM).

The difference in cohesion and adhesion properties of the two tie and release layers comes in particular from the difference in size of the silica bridges which are established between the particles with which they are formed and which is in particular linked to a process of oxidation and sintering during oxidizing treatment at different temperatures.

According to another of its aspects, the present invention aims to provide a process for forming a multilayer coating which has a tie layer and a release layer, on a surface of a substrate, in particular intended for contact with liquid silicon, characterized in that it comprises at least:
(a) the formation of a layer, termed tie layer, via:
  i) bringing said surface of the substrate into contact with a liquid suspension of powder of silicon nitride and optionally of silica, so as to form thereon a deposit of said suspension,
  ii) exposing the deposit formed in (a)i) to a heat treatment under an oxidizing atmosphere and under conditions sufficient to obtain a layer formed from a material having a silica content of between 10% and 55% by weight relative to the total weight thereof, and
(b) the formation of a release layer, distinct from the tie layer, via:
  i) bringing the surface of the substrate as obtained at the end of a step (a) into contact with a liquid suspension of powder of silicon nitride and optionally of silica, so as to form thereon a deposit of said suspension,
  ii) exposing the deposit formed in (b)i) to a heat treatment under an oxidizing atmosphere and under conditions sufficient to obtain a layer formed from a material having a silica content of between 2% and 10% by weight relative to the total weight thereof.

Advantageously, step (a) can be repeated at least once before step (b) is carried out.

According to one preferred embodiment, step (a)ii) is carried out for a period of between 1 and 4 hours, preferably of between 2 and 3 hours, and step (b)ii) is carried out for a period of between 1 and 4 hours, preferably of between 2 and 3 hours.

The process of the invention implements the depositing of the precursor materials of the layers forming the multilayer coating according to conventional and inexpensive techniques which make it possible to achieve a very good surface finish.

Advantageously, the substrate according to the invention, in particular intended to be brought into contact with molten silicon, is a crucible for solidifying a silicon ingot from molten silicon.

The invention also relates to a process for renewing a layer, termed release layer, on the internal surface of a crucible, already coated with at least one permanent layer, termed tie layer, formed from a material having a silica content of between 10% and 55% by weight relative to the total weight of said tie layer, characterized in that it comprises (i) bringing the external surface of the tie layer into contact with a liquid suspension of powder of silicon nitride and optionally of silica, so as to form thereon a deposit of said suspension, and (ii) exposing the deposit formed in i) to a heat treatment under an oxidizing atmosphere and under conditions sufficient to obtain a layer formed from a material having a silica content of between 2% and 10% by weight relative to the total weight thereof.

The present invention also relates to the use of a crucible as defined above, for solidifying a silicon ingot from molten silicon.

Other characteristics, advantages and modes of application of the substrate and of the process according to the invention will emerge more clearly on reading the description which follows, and which is given by way of illustration and is nonlimiting.

As specified above, the multilayer coating considered according to the invention is formed from at least:
one layer, termed tie layer, having an open porosity of at least 30% and formed from a material based on silica and on silicon nitride, said material having a silica content of between 10% and 55% by weight relative to the total weight thereof, and
one layer distinct from the tie layer, termed release layer, located at the surface of the tie layer, and formed from a material based on silica and on silicon nitride, said material having a silica content of between 2% and 10% by weight relative to the total weight thereof.

Tie Layer

The tie layer may represent at least 80% of the total thickness of the coating according to the invention, and it preferably represents between 80% and 90% of the total thickness of the coating.

Thus, it may have a thickness ranging from 100 to 500 micrometers, preferably ranging from 200 to 300 micrometers.

It constitutes a barrier to any infiltration of the silicon beyond the release layer described above. It is a layer which does not need to be renewed at each use.

The tie layer is also a cohesive layer.

The cohesion of the tie layer and its adhesion to the substrate is in particular provided by a high silica content, of between 10% and 55% by weight relative to the total weight thereof. Preferably, the tie layer has a silica content of between 25% and 50% by weight, relative to the total weight thereof.

In this layer, with a high oxygen content, the silica bridges are thick, thereby giving it a high cohesion.

In other words, the tie layer has a volume fraction of silica of between 14% and 64% by volume, relative to the total volume thereof.

It also has an oxygen content of between 5% and 30% by weight relative to the total weight thereof, preferably of between 13% and 27% by weight.

According to one implementation variant, the tie layer consists of one or more tie sublayer(s), having identical or different and preferably identical compositions.

For example, a layer may be made of two successive deposits of the same composition with an oxidation treatment of 2 hours at 1100° C. under air after each deposit.

FIG. 1 gives an account of the structure of such a layer. In the lower part, which corresponds to the first deposit having a higher oxygen concentration, the layer is more sintered, since it has undergone two oxidation treatments. Conversely, in the upper part corresponding to the second deposit which has undergone only one oxidation treatment, the layer is less sintered.

Release Layer

The release layer is thin and preferably less cohesive than the tie layer. It may have a thickness ranging from 10 to 100 micrometers, preferably ranging from 20 to 60 micrometers.

It is in particular intended to provide the thin layer that will be incorporated into the liquid silicon, and to allow easy detachment at the interface between the ingot and the coating.

This layer must be periodically renewed according to its wear.

Thus, the thickness of the release layer may be chosen according to the amount of coating that is incorporated into the silicon, dependent on the size of the ingot produced and the operating conditions, and on the desired frequency for renewing this layer.

In addition, the release layer has weak cohesion. Its cohesion is less than that of the tie layer.

The weak cohesion of the release layer results from its relatively low silica content, of between 2% and 10% by weight relative to the total weight thereof. Preferably, the release layer has a silica content of between 4% and 10% by weight, relative to the total weight thereof.

In other words, the release layer has a volume fraction of silica of between 3% and 14% by volume, relative to the total volume thereof.

It also has an oxygen content of between 1% and 5% by weight relative to the total weight thereof, preferably of between 2% and 5% by weight.

Advantageously, the release layer is produced from materials of purity at least equal to that of the materials used to produce the tie layer. In so far as the production of the release layer consumes little material, a prepurified material may also be used for producing this layer.

Figure 2:
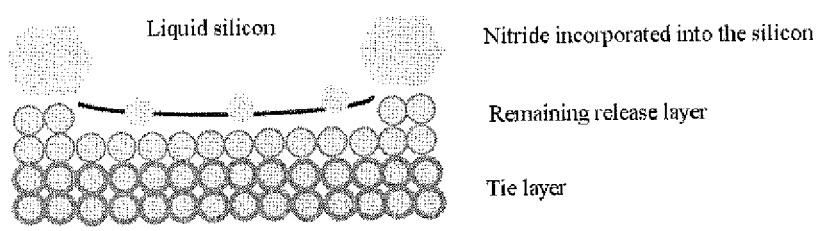

In this release layer, with a low oxygen content, the silica bridges are thin. The dissolution of the surface grains in the liquid silicon allows the formation of larger crystals at the interface. As illustrated in FIG. 2, which represents a diagram of the interface between the multilayer coating and the silicon, these crystals then constitute points of anchorage for the surface of the silicon.

The underlying powder grains are deoxidized by the silicon when they come into contact with said silicon. Thus, they detach from the coating. This results in a reduction in the contact surface of the silicon with the multilayer coating.

Figure 3:
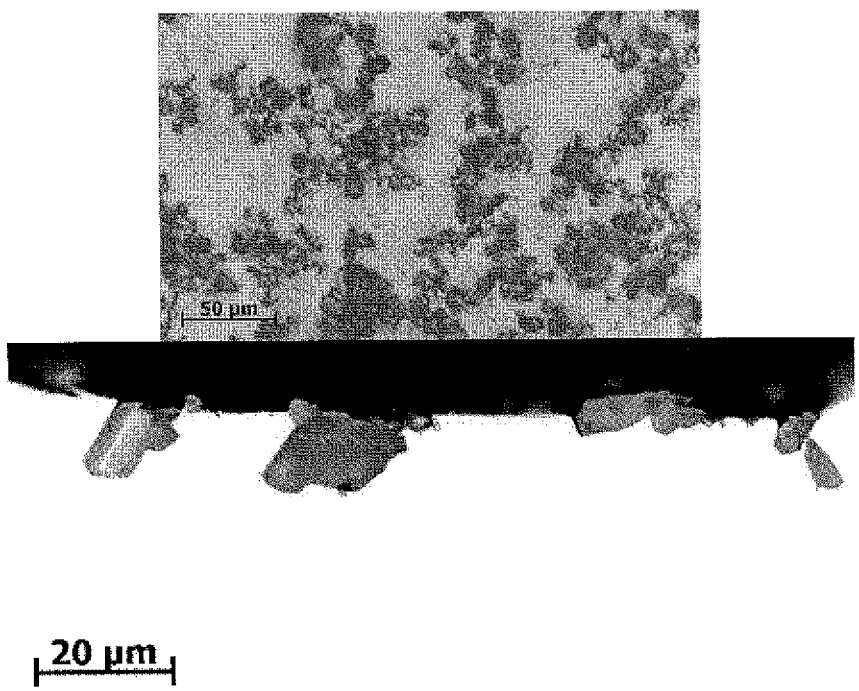

In this way, after solidification, the detachment of the silicon ingot takes place at the interface between the latter and the multilayer coating. Only the crystals and particles partially incorporated at the surface are entrained. FIG. 3 gives an account of this entrainment, by observation from above of a section of the surface of the solidified ingot.

In order to be easily purifiable, the two tie and release layers of the multilayer coating have a microstructure which does not constitute a barrier to the diffusion of the metal impurities.

Thus, according to one preferred mode of the invention, the tie and release layers each have an open porosity, in particular of between 30% and 80%, preferably of between 50% and 70%.

According to one implementation variant, the tie and release layers have distinct porosities.

The open porosity targeted by the invention may be quantified by various known measurement techniques, for example by image analysis by X-ray tomography, optical microscopy or optical macroscopy.

According to one preferred mode of the invention, the tie and release layers each have a specific surface area of between 5 $m^2/g$ and 15 $m^2/g$.

According to one implementation variant, the tie and release layers have distinct specific surface areas.

Process

According to another of its aspects, the present invention relates to a process for forming a multilayer coating which has a tie layer and a release layer, on a surface of a substrate, in particular intended for contact with liquid silicon, characterized in that it comprises at least:
(a) the formation of a layer, termed tie layer, via:
  i) bringing said surface of the substrate into contact with a liquid suspension of powder of silicon nitride and optionally of silica, so as to form thereon a deposit of said suspension,
  ii) exposing the deposit formed in (a)i) to a heat treatment under an oxidizing atmosphere and under conditions sufficient to obtain a layer formed from a material having a silica content of between 10% and 55% by weight relative to the total weight thereof, and
(b) the formation of a release layer, distinct from the tie layer, via:
  i) bringing the surface of the substrate as obtained at the end of a step (a) into contact with a liquid suspension of powder of silicon nitride and optionally of silica, so as to form thereon a deposit of said suspension,
  ii) exposing the deposit formed in (b)i) to a heat treatment under an oxidizing atmosphere and under conditions sufficient to obtain a layer formed from a material having a silica content of between 2% and 10% by weight relative to the total weight thereof.

The particles of silica and of silicon nitride used in the process for preparing the coating according to the invention are preferably in the form of powders, preferably having a size or a mean diameter ranging from 500 nanometers to 5 microns, preferably from 0.8 microns to 2 microns.

As previously specified, step (a) may be repeated at least once before step (b) is carried out.

Steps (a) and (b) of the process according to the invention are distinct steps.

For obvious reasons, the number of layers in the coating in accordance with the invention will depend on the number of repetitions of steps (a) and (b).

The bringing of the liquid suspensions into contact with the internal surface of the substrate in steps (a)i) and (b)i) may be carried out by any conventional technique known to those skilled in the art. For example, it may be deposited by dip coating, by spin coating, by spray coating or else using a brush.

Preferably, it is carried out by applying each of the suspensions, with a brush and/or with a spray gun, on to the internal surface, intended to be in contact with liquid silicon, of the substrate.

These application techniques are clearly within the competence of those skilled in the art and are not described in detail herein.

The use of a liquid suspension makes it possible to produce a deposit which has a very good surface finish.

Those skilled in the art are able to choose the composition of the atmosphere, and to adjust the temperature and the duration for carrying out steps (a)ii) and (b)ii), so as to form the layers in accordance with the invention.

In particular, steps (a)ii) and (b)ii) are carried out under an oxidizing atmosphere, for example under air.

Preferably, step (a)ii) is carried out under conditions sufficient to obtain a layer formed from a material having a silica content of between 25% and 50% by weight, relative to the total weight thereof.

In particular, step (a)ii) is carried out at a temperature greater than 900° C., in particular of between 900° C. and 1100° C., and preferably of between 900° C. and 1000° C.

More specifically, the deposit formed in step (a)i) is brought to a fixed temperature hold greater than 900° C., in particular of between 900° C. and 1100° C., and preferably of between 900° C. and 1000° C.

The duration of the temperature hold of step (a)ii) is between 1 and 4 hours, in particular between 2 and 3 hours.

Advantageously, step (b)ii) is carried out under conditions sufficient to obtain a layer formed from a material having a silica content of between 4% and 10% by weight, relative to the total weight thereof.

In particular, step (b)ii) is carried out at a temperature of less than 900° C., preferably of between 600° C. and 900° C., and in particular of between 700° C. and 900° C.

More specifically, the deposit formed in step (b)i) is brought to a fixed temperature hold of less than 900° C., preferably of between 600° C. and 900° C., and in particular of between 700° C. and 900° C.

The duration of the temperature hold of step (b)ii) is between 1 and 4 hours, preferably between 2 and 3 hours.

An initial purification of the coating may be carried out by a pretreatment under vacuum up to a temperature of from 1000° C. to 1200° C., then under gas up to a temperature at least equal to the crystallization temperature, i.e. between 1400° C. and 1500° C. The tie layer is then purified by extraction of the impurities to the liquid silicon itself during the successive crystallization cycles.

Substrate

The invention may be advantageously carried out on any type of substrate.

Preferably, the substrates according to the invention are formed from materials chosen from silicon carbide, silicon nitride, silica, graphite and composites comprising graphite and silicon carbide or comprising graphite and silicon nitride.

As specified above, these substrates are advantageously intended to be used with liquid silicon.

In this respect, it may for example be formed from a material made of dense ceramic, for example of silicon carbide (SiC), of silicon nitride ($Si_3N_4$), or of silica, or from a porous material, for example made of graphite, or from a composite material comprising graphite and silicon carbide or comprising graphite and silicon nitride.

In particular, it will be possible to choose a material made of graphite, and in particular made of isostatic, pyrolytic, vitreous, fibrous, carbon-carbon composite or flexible graphite that advantageously has good temperature resistance.

One of the advantages of the present invention is that the coating according to the invention may be used on all types of substrates without risk of prejudicial interactions between the substrate and the content thereof, in particular the liquid silicon.

The substrate is advantageously a crucible or mold, and more particularly a crucible for solidifying a silicon ingot from molten silicon.

When a substrate made of porous material, in particular made of graphite, is used, the substrate may also comprise, at least partially on one surface, an intermediate dense layer.

Such an intermediate insulating layer is intended to insulate said substrate from the coating layers.

Such insulating layers are well known to those skilled in the art.

This intermediate insulating layer affixed to the surface of the material forming said substrate may in particular be a dense and continuous layer of ceramic capable of providing barrier, or even antioxidant, behavior.

According to one particular implementation variant, the tie layer is deposited on the substrate made of porous material of graphite type precoated with an impermeabilizing layer, for example made of silicon carbide.

When the substrate is formed from a material made of graphite, the process according to the invention may comprise, prior to step (a), the formation of a silicon carbide layer deposited by CVD (chemical vapor deposition) on the surface to be treated of said substrate.

As emerges from the examples hereinafter of the crucibles in accordance with the invention, the invention makes it possible to limit, or even prevent, contamination of the silicon ingot, and to thus obtain silicon ingots of greater purity compared with those obtained to date, this being while implementing conventional and inexpensive depositing techniques.

In the text, the expressions "of between . . . and . . ." and "ranging from . . . to . . ." are equivalent and are intended to signify that the limits are included, unless otherwise mentioned.

Unless otherwise mentioned, the expression "containing/comprising a" should be understood as "containing/comprising at least one".

The invention will now be described by means of the following figures and examples given of course by way of nonlimiting illustration of the invention.

FIGURES

FIG. 1: Scanning electron microscope image of a coating made of two successive deposits with oxidation treatment of 2 hours at 1100° C. under air after each deposit.

FIG. 2: Diagram of the interface between the multilayer coating and the silicon.

FIG. 3: View from above of a section of the surface of a silicon ingot produced in a crucible coated with a tie layer oxidized for 2 hours at 900° C. and with a release layer oxidized for 2 hours at 600° C.

EXAMPLE

The crucible used is a crucible made of graphite of size G1 precoated with a silicon carbide layer.

Formation of the Multilayer Coating of the Crucible

A multilayer coating according to the invention was formed on this crucible, according to the following protocol.

Two first layers of the multilayer coating are produced by spray coating a submicronic powder of $Si_3N_4$, having a specific surface area of about 11 $m^2/g$, in suspension in water, on to the internal surface of the crucible.

The layers are oxidized by heating under air so as to give them their cohesion and their function of barrier to infiltration of the liquid silicon. The two layers are thus oxidized in air at 1100° C. for 2 hours. This results in a silica fraction of 64% by volume (equivalent to an oxygen content of 29% by weight), and a silica-layer thickness of 25 nm.

The two successive sublayers constituting the tie layer each have a thickness of approximately 150 μm, the final thickness of the tie layer being less than 300 μm. The layer thus obtained is hard and adherent to the crucible.

An external release layer having a thickness of 20 μm is subsequently deposited in one step and then oxidized in the air at 900° C. for 2 hours. This results in a silica fraction of 13% by volume (equivalent to an oxygen content of 5% by weight), and a silica-layer thickness of 5 nm.

The new release layer obtained is pulverulent.

After a first silicon crystallization cycle, the silicon ingot spontaneously detaches while entraining a part of the release layer of the multilayer coating. On the other hand, the tie layer remains totally adherent to the crucible.

A new release layer having a thickness of 20 μm is subsequently deposited and oxidized in air for 2 hours at 900° C.

A second ingot is then produced.

Analysis of the Purity of the Ingots Obtained

The crucible coated according to the invention thus formed is tested as follows:

The effect of purifying the coating is demonstrated by performing a compared analysis of samples of powders taken before and after crystallization.

Thus, the table below presents the concentrations of various metal elements measured by GDMS (glow discharge mass spectrometry) on a coating before crystallization, and also after the first and second crystallization of the example above.

| ppm weight | Initial coating | After 1 crystallization | After 2 crystallizations |
|---|---|---|---|
| B | 130 | 1.3 | 0.72 |
| Na | 170 | 1.2 | 0.96 |
| Mg | 2.9 | 1.0 | 0.36 |
| Al | 21 | 6.6 | 6.6 |
| Ca | 20 | 19 | 11 |
| Ti | 0.55 | 0.13 | 0.14 |
| Cr | 3.5 | 0.45 | 0.26 |
| Fe | 16 | 4.5 | 3.4 |
| Zr | 0.58 | <0.1 | <0.1 |
| Mo | 6.4 | 0.23 | 0.23 |

It is noted that, during the successive crystallization cycles, the concentrations of various metal elements decrease. Advantage is thus taken of the purification resulting from the successive cycles of melting and of crystallization of the silicon.

The crucible according to the invention is therefore reusable and suitable for the depositing of a new release layer so as to undergo a further cycle of crystallization of highly pure silicon ingots.

The invention claimed is:

1. A substrate being at least partially surface-coated with a multilayer coating formed from at least:
   one layer, termed tie layer, contiguous with said substrate, having an open porosity of at least 30%, and formed from a material based on silica and on silicon nitride, said material having a silica content of between 10% and 55% by weight relative to the total weight thereof, and
   one layer distinct from the tie layer, termed release layer, located at the surface of the tie layer, and formed from a material based on silica and on silicon nitride, said material having a silica content of between 2% and 10% by weight relative to the total weight thereof.

2. The substrate as claimed in claim 1, wherein the material forming the tie layer has a silica content of between 25% and 50% by weight, relative to the total weight thereof.

3. The substrate as claimed in claim 1, wherein the material forming the release layer has a silica content of between 4% and 10% by weight, relative to the total weight thereof.

4. The substrate as claimed in claim 1, wherein the tie layer represents at least 80% of the total thickness of said coating.

5. The substrate as claimed in claim 1, wherein the tie layer has a thickness of between 100 and 500 micrometers, and the release layer has a thickness of between 10 and 100 micrometers.

6. The substrate as claimed in claim 1, wherein said tie and release layers each have an open porosity.

7. The substrate as claimed in claim 1, wherein said tie and release layers each have a specific surface area of between 5 $m^2/g$ and 15 $m^2/g$.

8. The substrate as claimed in claim 1, wherein the tie layer consists of one or more tie sublayer(s), having identical or different compositions.

9. The substrate as claimed in claim 1, wherein said substrate is formed from a material chosen from silicon carbide, silicon nitride, silica, graphite and composites comprising graphite and silicon carbide or comprising graphite and silicon nitride.

10. The substrate as claimed in claim 1, being a crucible for solidifying a silicon ingot from molten silicon.

11. A substrate according to claim 1, being intended for contact with liquid silicon.

12. A process for forming a multilayer coating which has a tie layer and a release layer, on a surface of a substrate, comprising at least:
   (a) the formation of a layer, termed tie layer, via:
      i) bringing said surface of the substrate into contact with a liquid suspension of powder of silicon nitride and optionally of silica, so as to form thereon a deposit of said suspension,
      ii) exposing the deposit formed in (a)i) to a heat treatment under an oxidizing atmosphere and under conditions sufficient to obtain a layer contiguous with said substrate having an open porosity of at least 30%, and formed from a material having a silica content of between 10% and 55% by weight relative to the total weight thereof, and
   (b) the formation of a release layer, distinct from the tie layer, via:
      i) bringing the surface of the substrate as obtained at the end of a step (a) into contact with a liquid suspension of powder of silicon nitride and optionally of silica, so as to form thereon a deposit of said suspension,
      ii) exposing the deposit formed in (b)i) to a heat treatment under an oxidizing atmosphere and under conditions sufficient to obtain a layer located at the surface of the tie layer, and formed from a material having a silica content of between 2% and 10% by weight relative to the total weight thereof.

13. The process as claimed in claim 12, wherein step (a) is repeated at least once before step (b) is carried out.

14. The process as claimed in claim 12, wherein step (a)ii) is carried out at a temperature greater than 900° C.

15. The process as claimed in claim 12, wherein step (b)ii) is carried out at a temperature of less than 900° C.

16. The process as claimed in claim 12, wherein step (a)ii) is carried out for a period of between 1 and 4 hours and step (b)ii) is carried out for a period of between 1 and 4 hours.

17. The process as claimed in claim 12, wherein the substrate is a crucible for solidifying a silicon ingot from molten silicon.

18. A process for renewing a layer, termed release layer, on the internal surface of a crucible, already coated with at least one permanent layer, termed tie layer, contiguous with said substrate having an open porosity of at least 30%, and formed from a material having a silica content of between 10% and 55% by weight relative to the total weight of said tie layer, comprising (i) bringing the external surface of the tie layer into contact with a liquid suspension of powder of silicon nitride and optionally of silica, so as to form thereon a deposit of said suspension, and (ii) exposing the deposit formed in i) to a heat treatment under an oxidizing atmosphere and under conditions sufficient to obtain a layer located at the surface of the tie layer formed from a material having a silica content of between 2% and 10% by weight relative to the total weight thereof.

19. A process for solidifying a silicon ingot from molten silicon comprising at least the step of using a substrate as claimed in claim 1 as a crucible.

\* \* \* \* \*